United States Patent [19]

Stephens

[11] Patent Number: 5,471,398

[45] Date of Patent: Nov. 28, 1995

[54] MTOL SOFTWARE TOOL FOR CONVERTING AN RTL BEHAVIORAL MODEL INTO LAYOUT INFORMATION COMPRISING BOUNDING BOXES AND AN ASSOCIATED INTERCONNECT NETLIST

[75] Inventor: Arthur Stephens, Sugar Land, Tex.

[73] Assignee: Texas Instruments Incorporated, Dallas, Tex.

[21] Appl. No.: 724,286

[22] Filed: Jul. 1, 1991

[51] Int. Cl.$^6$ ........................................... G06F 17/50
[52] U.S. Cl. .................... 364/490; 364/488; 364/489; 364/491
[58] Field of Search ...................... 364/488, 489, 364/490, 491, 378

[56] References Cited

U.S. PATENT DOCUMENTS

| | | | |
|---|---|---|---|
| 4,635,208 | 1/1987 | Coleby et al. | 364/491 |
| 4,651,284 | 3/1987 | Watanabe et al. | 364/491 |
| 4,703,435 | 10/1987 | Darringer et al. | 364/489 |
| 4,831,543 | 5/1989 | Mastellone | 364/489 |
| 4,918,614 | 4/1990 | Modarres et al. | 364/490 |
| 4,922,432 | 5/1990 | Kobayashi et al. | 364/490 |
| 4,967,367 | 10/1990 | Piednoir | 364/489 |
| 5,029,102 | 7/1991 | Drumm et al. | 364/489 |
| 5,067,091 | 11/1991 | Nakazawa | 364/490 |
| 5,084,824 | 1/1992 | Lam et al. | 364/490 |
| 5,111,413 | 5/1992 | Lazansky et al. | 364/578 |
| 5,146,583 | 9/1992 | Matsunaka et al. | 395/500 |
| 5,222,030 | 6/1993 | Dangelo et al. | 364/489 |
| 5,229,953 | 7/1993 | Isozaki et al. | 364/490 |
| 5,258,919 | 11/1993 | Yamanouchi et al. | 364/489 |

OTHER PUBLICATIONS

Rundensteiner et al., "The Component Synthesis Algorithm: Technology Mapping For Register Transfer Description," *1990 IEEE*, pp. 208–211.

*Primary Examiner*—Kevin J. Teska
*Assistant Examiner*—Leigh Marie Garbowski
*Attorney, Agent, or Firm*—Robert D. Marshall, Jr.; James C. Kesterson; Richard L. Donaldson

[57] ABSTRACT

An MtoL software tool (FIG. 3) automates the process of converting an RTL behavioral model of the integrated circuit into corresponding layout information in a format that can be input directly to a floor planner/block router—the automated MtoL process facilitates iterative logic design including what-if analysis. A conventional RTL behavioral model is modified (40) to include MtoL bounding box and interconnect netlist macros. The resulting modified RTL module tree (42) is input to an MtoL extraction front-end (43) for conversion to an MtoL-formatted MtoL extract tree. A flattening transformation (44) on the hierarchical MtoL extract tree produces a non-hierarchical representation of the block structure together with a terminal interconnect netlist. The MtoL program then generates (45) MtoL layout information comprising a corresponding set of bounding boxes with terminal data and the associated interconnect netlist information, appropriately formatted for input to the floor planner/block router.

12 Claims, 5 Drawing Sheets

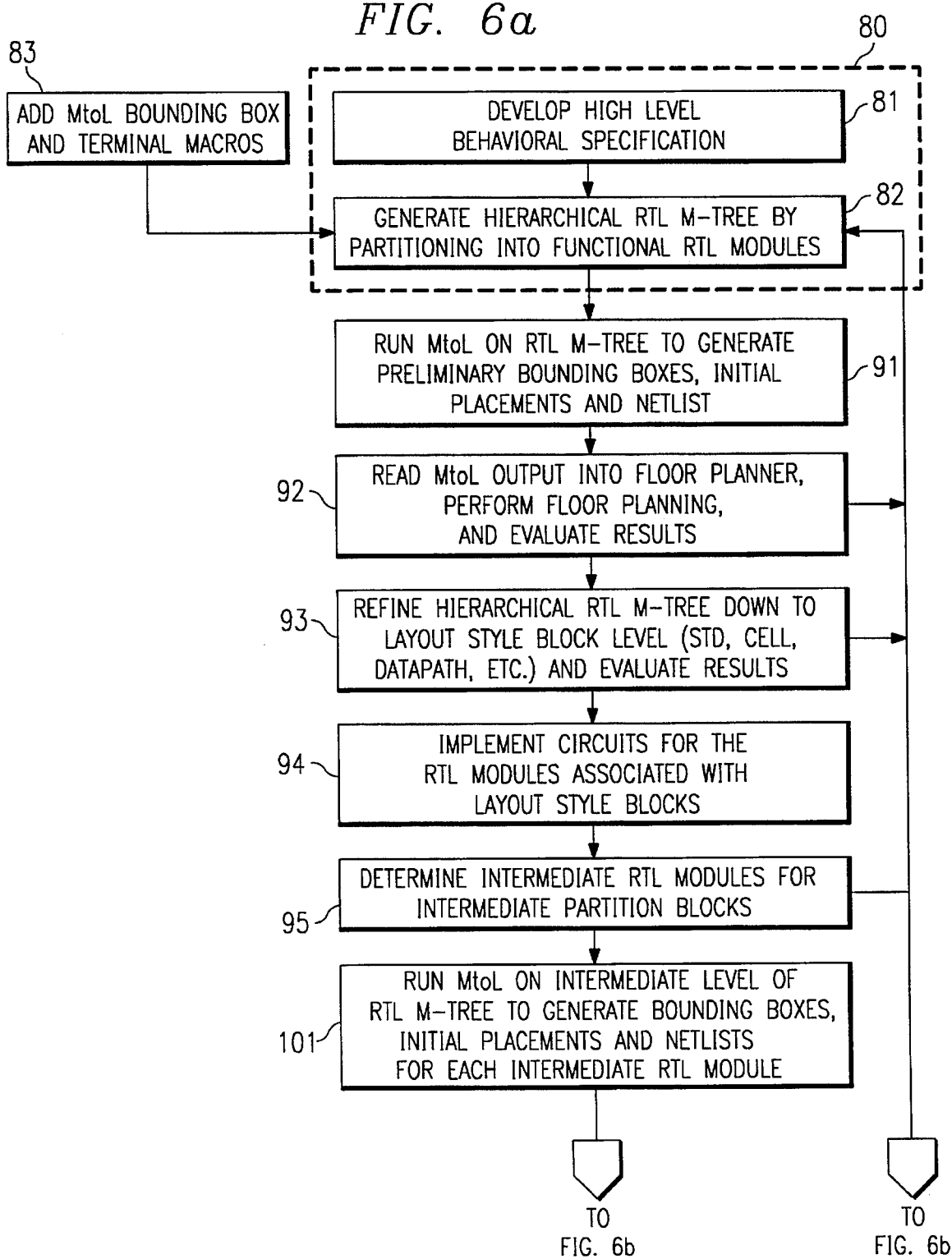

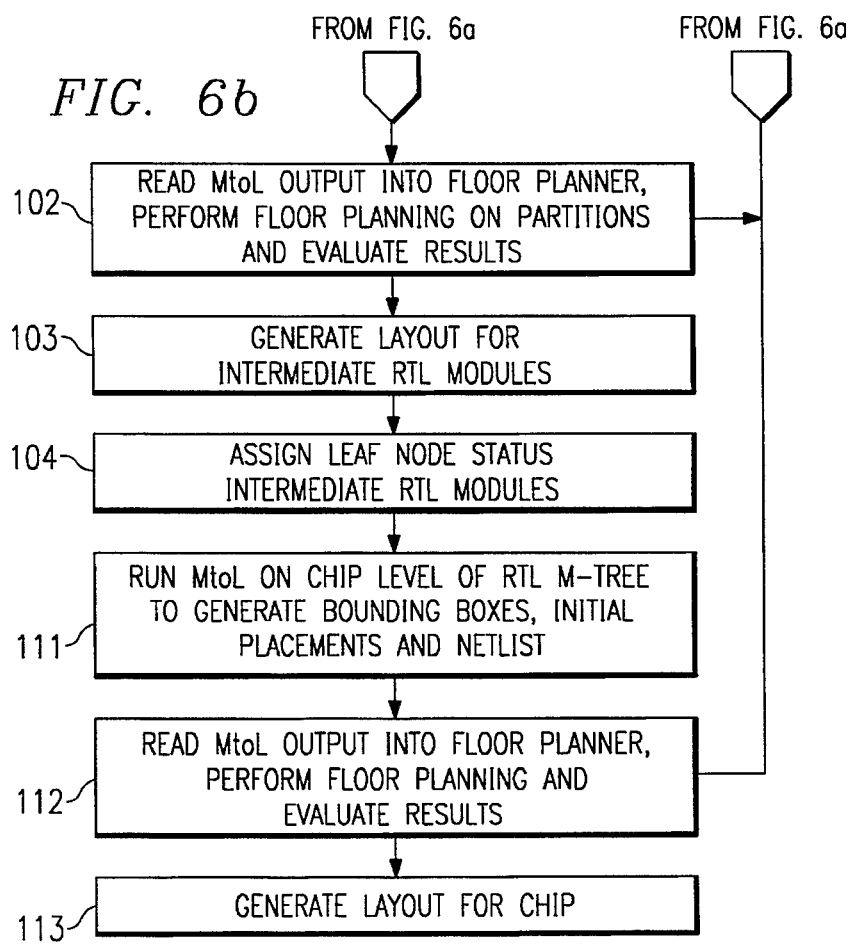
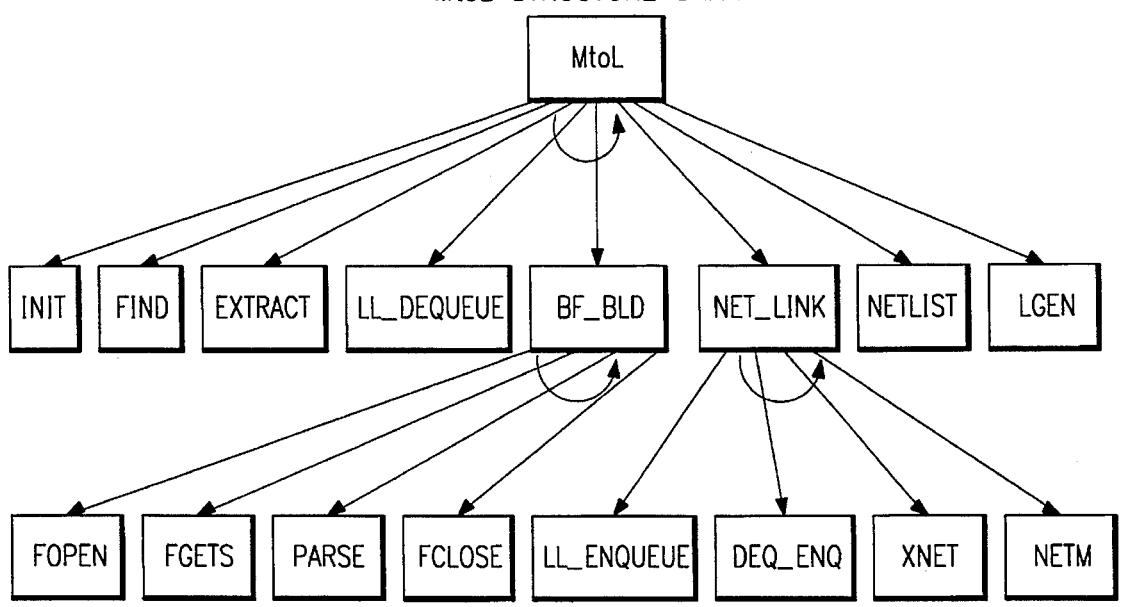

MTOL SOFTWARE TOOL FOR CONVERTING AN RTL BEHAVIORAL MODEL INTO LAYOUT INFORMATION COMPRISING BOUNDING BOXES AND AN ASSOCIATED INTERCONNECT NETLIST

TECHNICAL FIELD OF THE INVENTION

The invention relates generally to computer aided logic design, and more particularly relates to an MtoL software tool for converting an RTL (register transfer level) behavioral model representing the logic structure and functionality of an integrated circuit, into MtoL layout information comprising bounding boxes (including geometry, terminal location, and placement) and an associated terminal interconnect netlist. In even greater particularity, the MtoL program replaces schematic capture as a tool for converting the structural information contained in a conventional RTL behavioral model into layout information that can be input to a conventional floor planner and/or block router—the automated MtoL process facilitates iterative design including what-if analysis.

BACKGROUND OF THE INVENTION

Computer aided logic design of integrated circuits includes modeling tools that simulate a logic design characterized as an RTL behavioral model, schematic capture tools that convert the logic structure in an RTL behavioral model into layout information, and floor planning/block routing tools that use the layout information to generate semiconductor fabrication information.

Without limiting the scope of the invention, this background information is provided in the context of a specific problem to which the invention has application: making the process of converting the logic structure of an RTL behavioral model M into layout information L (MtoL) more efficient by replacing semi-automated schematic capture tools with an automated MtoL tool. Automating the MtoL process would facilitate the use of what-if analysis to optimize the integrated circuit design.

RTL (register transfer level) behavioral models are generated in the initial stages of computer aided logic design to represent the logic structure and functionality of an integrated circuit. The RTL behavioral model is input to a modeling tool, which simulates the operation of the integrated circuit based on the functionality assigned to the various logic blocks.

The RTL behavioral model, which is written in a modeling language appropriate for the modeling tool, is built in the configuration of an executable hierarchical RTL module tree including software RTL modules that define logic blocks, together with the associated functionality that characterizes the operation of those blocks. The logic structure represented by the model is hierarchical down to the layout style block level, designated leaf nodes, so that the model takes the form of an hierarchical module tree including leaf nodes at the lowest level of the hierarchy.

Thus, an integrated circuit may include a CPU that includes an ALU and a CLU, each of which is made up of two standard layout style logic blocks: data path and standard cell. The layout style blocks are characterized by standard gate-level logic cells which form the basic logic building blocks for the integrated circuit design.

Block routing tools generate semiconductor fabrication information that can be used to generate photolithographic masks and to control etching layout operations. The block router processes layout information in the form of a set of bounding boxes (including geometry, terminal location, and placement) and an associated terminal interconnect netlist. A floor planner tool may be used as a graphical preprocessor to the block router for optimizing block placement, size, and aspect ratio.

Schematic capture tools are used in converting the RTL behavioral modes—specifically, the RTL modules that represent the hierarchical logic block structure—into layout information for input to the block router (or floor planner). However, while schematic capture tools automate the generation of layout information, they do not operate directly on the RTL behavioral model. Rather, a trained user must convert RTL modules into an intermediate set of schematic icons.

Schematic capture tools are disadvantageous in a number of respects. Because the conversion of RTL modules (logic blocks) into schematic icons is not automated, this process is time consuming and susceptible to errors. To achieve any significant level of efficiency for this process requires a substantial investment in training. Moreover, the effort involved in generating an icon set makes impractical any significant amount of iterative what-if analysis of the logic design.

Accordingly, a need exists for an automated MtoL tool to convert an RTL behavioral model the layout information that can be input to a block router (or floor planner) for generating semiconductor fabrication information.

SUMMARY OF THE INVENTION

The invention is an automated MtoL process that converts an RTL behavioral model into corresponding MtoL layout information comprising bounding boxes (including geometry and terminal location), initial bounding box placements, and an associated terminal interconnect netlist. Thus, the MtoL program provides an interface between the RTL behavioral modeling process and block routing operations.

In one aspect of the invention, the MtoL process accepts as input the hierarchical RTL module tree that represents the RTL behavioral model—RTL modules (representing the hierarchical logic block structure) and associated functionality. The MtoL process includes: (a) extracting from the RTL module tree the hierarchical RTL modules to create a corresponding hierarchical MtoL extract tree; (b) performing a flattening transformation of the hierarchical MtoL extract tree to provide a non-hierarchical representation including a terminal interconnect netlist; and (c) generating MtoL layout information including bounding boxes and associated terminal and terminal interconnect netlist information.

In another aspect of the invention, the MtoL process assigns to selected ones of the RTL modules MtoL bounding box and terminal macros that define a corresponding bounding box geometry and terminal location. The extract function of the MtoL process extracts these MtoL macros along with the RTL modules when creating the MtoL extract tree.

In an exemplary embodiment, the extract function operates as a front-end interface that converts the RTL modules written in an arbitrary modeling language into extract files according to an MtoL input format. The layout generation function is configured to generate layout information according to the layout language appropriate for a selected floor planner and/or block router.

In general, the flattening transformation is accomplished by: (a) performing a breadth first traversal through the hierarchical MtoL extract tree to identify all leaf nodes, which correspond to layout style blocks or intermediate blocks designated as leaf nodes by an MtoL leaf macro; and (b) performing a depth first search of the MtoL extract tree to generate a linked list of interconnected groups (nets) of terminals excluding terminals contained in the intermediate blocks of the hierarchy (i.e., a netlist that describes a routing network).

The layout generation function uses the list of leaf nodes and the netlist to output MtoL layout information—bounding boxes (including geometry and terminal location), initial bounding box placements, and an associated terminal interconnect netlist. In particular, for leaf nodes designated by MtoL leaf macros, the layout generation function either (a) generates MtoL layout information using the MtoL bounding box and terminal macros, or (b) if an MtoL exist macro is assigned to the node, retrieves a corresponding external layout information file for output by the MtoL system as MtoL layout information.

The MtoL program is used in an iterative logic design process in which the MtoL layout information generated by the MtoL process is evaluated, and then either (a) accepted as the final layout information, or (b) used to modify the RTL behavioral model for further simulation followed by a repeat of MtoL processing. This iterative design process, including what-if analysis, can encompass modification of the RTL behavioral model even in connection with evaluating the results or floor planning and block routing.

The technical advantages of the invention include the following. The MtoL process offers an automated software tool for converting an RTL behavioral model into corresponding MtoL layout information, facilitating an iterative logic design process. The MtoL program includes a front end extract function for interfacing to an RTL behavioral model written in a selected modeling language. In addition, it includes a layout generation function that outputs MtoL layout information according to a specified layout language.

BRIEF DESCRIPTION OF THE DRAWINGS

For a more complete understanding of the invention, and for further features and advantages, reference is now made to the following Detailed Description of an exemplary embodiment of the invention, taken in conjunction with the accompanying Drawings, in which:

FIGS. 6a and 6b are a flow diagram of an iterative logic design application using the MtoL process; and FIG. 7 is an MtoL structure chart illustrating the MtoL software functions.

DETAILED DESCRIPTION OF THE INVENTION

The Detailed Description of an exemplary embodiment of the MtoL software tool is organized as follows:
1. MtoL Methodology
 1.1. RTL Behavioral Model
 1.2. MtoL Process
  1.2.1. MtoL Input Format
  1.2.2. MtoL Macros
 1.3. Iterative Design Application
2. MtoL Program Structure
3. Conclusion The exemplary MtoL software tool is used to convert a conventional hierarchical RTL behavioral model into MtoL layout information for input to a conventional floor planner and/or block router. It is assumed that the modeling language in which the RTL behavioral model is written is not compatible with the MtoL program.

1. MtoL Methodology. The exemplary automated MtoL software is designed as a tool in a computer aided logic design process for integrated circuits. The exemplary MtoL tool automates the process of converting an RTL behavioral model of the integrated circuit into corresponding MtoL layout information in a format that can be input directly to a floor planner/block router for generating semiconductor fabrication information.

Figure 1:
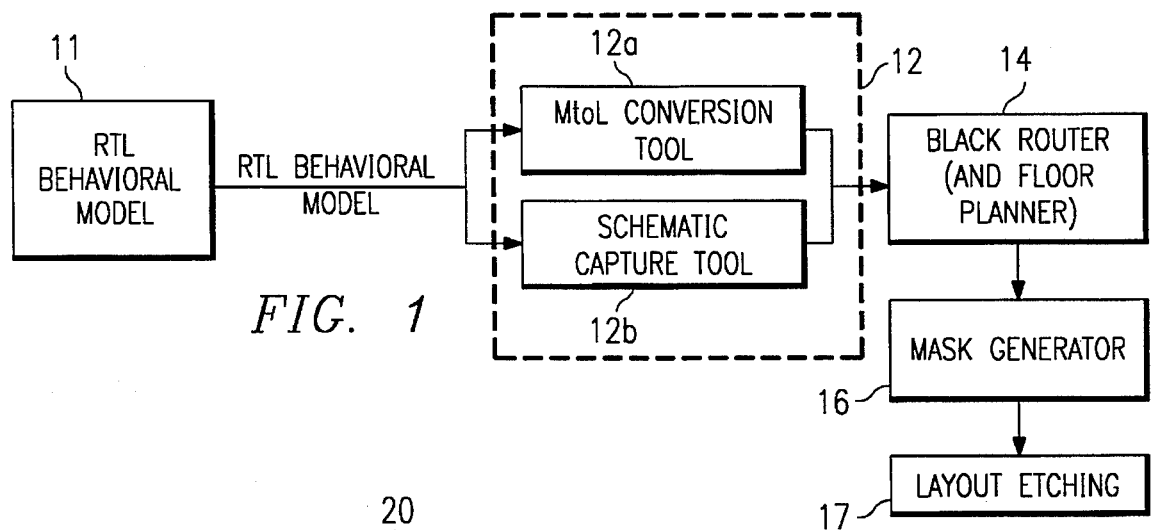
FIG. 1 illustrates a computer aided logic design process in which an RTL behavioral model is converted into MtoL layout information for input to a block router (or floor planner) which generates semiconductor fabrication information for the integrated circuit.

FIG. 1 illustrates the computer aided design process. A conventional hierarchical RTL model 11 represents the logic structure and functionality for an integrated circuit design. Based on that logic structure and associated functionality, an RTL modeling tool is used to simulate the design.

After an RTL behavioral model is completed (including simulation), a conversion operation 12 converts the logic structure contained in the RTL model into corresponding appropriately formatted layout information. The layout information comprises bounding boxes (including geometry and terminal location), initial bounding box placements, and an associated terminal interconnect netlist information (i.e., the layout of the logic blocks including geometry and placement, terminal location, and terminal interconnection).

The formatted layout information is input to a conventional block router 14. A conventional floor planner may be used to pre-process the MtoL layout information. The block router uses the layout information to generate semiconductor fabrication data used to generate photolithographic masks 16 and to implement layout etching operations 17.

As described in the Background, the conversion operation 12 has heretofore been implemented by a semiautomated schematic capture tool 12a. The MtoL system 12b provides an automated tool for implementing this conversion process to provide formatted MtoL layout information.

Figure 2A:
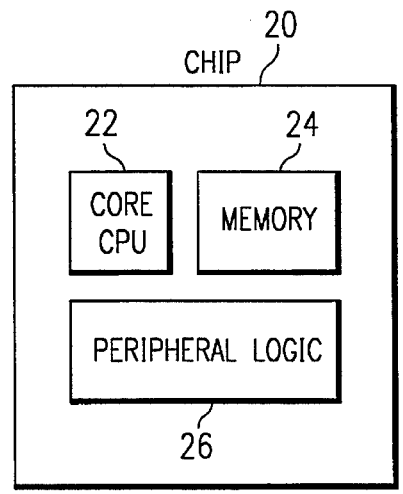
FIGS. 2a and 2b respectively illustrate an integrated circuit and its associated hierarchical logic block representation.

1.1. RTL Behavioral Model. FIG. 2a illustrates an exemplary integrated circuit chip 20. It includes a core CPU 22, Memory 24, and Peripheral Logic 26.

Figure 2B:
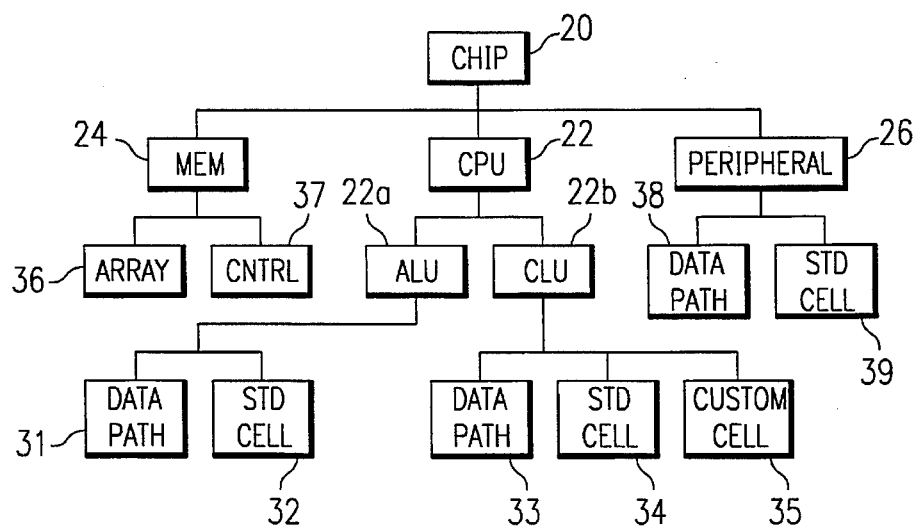

FIG. 2b represents the structure of an exemplary hierarchical RTL behavioral model for the chip 20, which includes a CPU 22, an Memory unit 24, and Peripheral logic 26. The CPU 22 is made up of an ALU (arithmetic logic unit) 22a and a CLU (control logic unit) 22b.

The ALU is made up of data path logic 31 and standard cell logic 32; the CLU is made up of data path logic 33, standard cell logic 34, and a custom cell logic 35. The Memory 24 is made up of an array 36 and controller logic 37. The Peripheral Logic is made up of data path logic 38 and standard cell logic 39.

For each of the intermediated functional blocks of the chip hierarchy—CPU, Memory, and Peripheral Logic—the lowest level component logic blocks are the layout style logic blocks of the behavioral model. These layout style blocks—array, controller, data path, standard cell, and custom cell—are characterized by gate-level logic cells. A custom cell designates a logic cell that may contain custom logic.

1.2. MtoL Process. The MtoL program processes an executable hierarchical RTL module tree comprising a set of RTL software modules that define intermediate and layout style logic blocks (with characteristic geometries), together with the associated terminal and terminal interconnect information.

Figure 3:
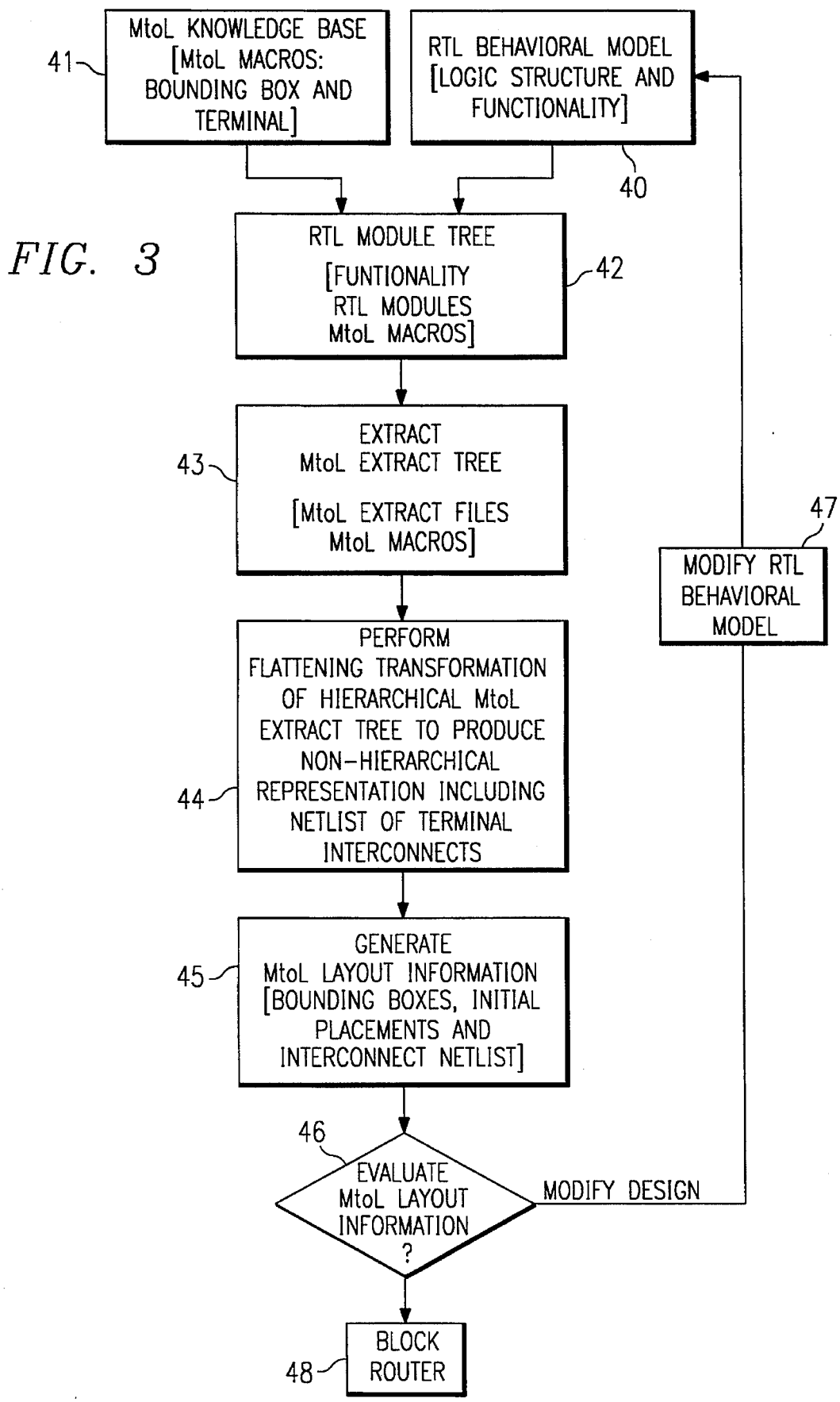
FIG. 3 illustrates the basic MtoL process for converting an RTL behavioral model into MtoL layout information.

FIG. 3 illustrates the basic MtoL process. The first step is to modify the RTL behavioral model (40) to include MtoL macros that represent an MtoL knowledge base (41). The MtoL macros provide information used by the MtoL program to define bounding box geometries and terminal locations (see, Section 1.2.2).

The MtoL macros are inserted in a text editing operation, and are invisible to the modeling tool. They are not required—if they are absent the MtoL program will use default bounding box geometries (the smallest bounding box that will accommodate the bounding box terminals) and default terminal locations (a random distribution of terminals around the bounding box). However, it will generally be preferable to specifically define these parameters using the MtoL bounding box and terminal macros.

The resulting modified RTL module tree (42) includes RTL modules (which define logic block structure), functionality, and the appropriate MtoL macros. Because the MtoL macros are invisible to the modeling tool, simulations using the RTL module tree are unaffected by this modification.

Since it is assumed that the RTL modules are written in a modeling language that is incompatible with the MtoL program, the MtoL program includes an MtoL extraction front-end to convert the RTL modules into an MtoL input format. Specifically, the MtoL extraction front-end extracts (43) MtoL extract files corresponding to the RTL modules, together with the MtoL macros—the RTL modules are converted to MtoL extract files according to the MtoL input format (see, Section 1.2.1.). That is, the hierarchical RTL module tree is converted into a corresponding hierarchical MtoL extract tree including MtoL extract files (in place of RTL modules) and MtoL macros.

Next, a flattening transformation (44) is performed on the hierarchical MtoL extract tree to produce a non-hierarchical representation of the block structure together with a terminal interconnect netlist. In general, the flattening transformation is accomplished by: (a) performing a breadth first traversal through the hierarchical MtoL extract tree to identify all leaf nodes, which are layout style blocks or intermediate blocks designated as leaf nodes; and (b) performing a depth first search of the MtoL extract tree to generate a list of interconnected groups of terminals excluding terminals contained in the intermediate blocks of the hierarchy.

Regarding the assignment of leaf node status to intermediated blocks, the MtoL extract tree can include MtoL leaf macros that are interpreted as a leaf nodes. These MtoL leaf macros identify an external file of layout information which can be retrieved for output by the MtoL system as MtoL layout information. (See, Section 1.2.3.)

Using the non-hierarchical representation of the block structure with the associated terminal interconnect netlist, the MtoL program then generates (45) MtoL layout information comprising a corresponding set of bounding boxes with terminal data and the associated interconnect netlist information. The MtoL layout information is generated in the format appropriate for a selected block routing tool.

The logic design process, including the MtoL process for generating MtoL layout information, can be iterative. After running the MtoL process, the resulting MtoL layout information can be evaluated (46) (such as by using a floor planner) and what-if analysis performed.

If modifications to the logic design are identified, the RTL behavioral model can be modified (47), and the modeling tool used to simulate the changed logic design. Once modifications to the RTL behavioral model are accepted, the MtoL process is repeated. This iterative process can encompass the block routing process (48), i.e., the results of the block routing process can be evaluated and used to perform what-if analysis to identify further modifications to the behavioral model. (See, Section 1.3.)

Figure 4:
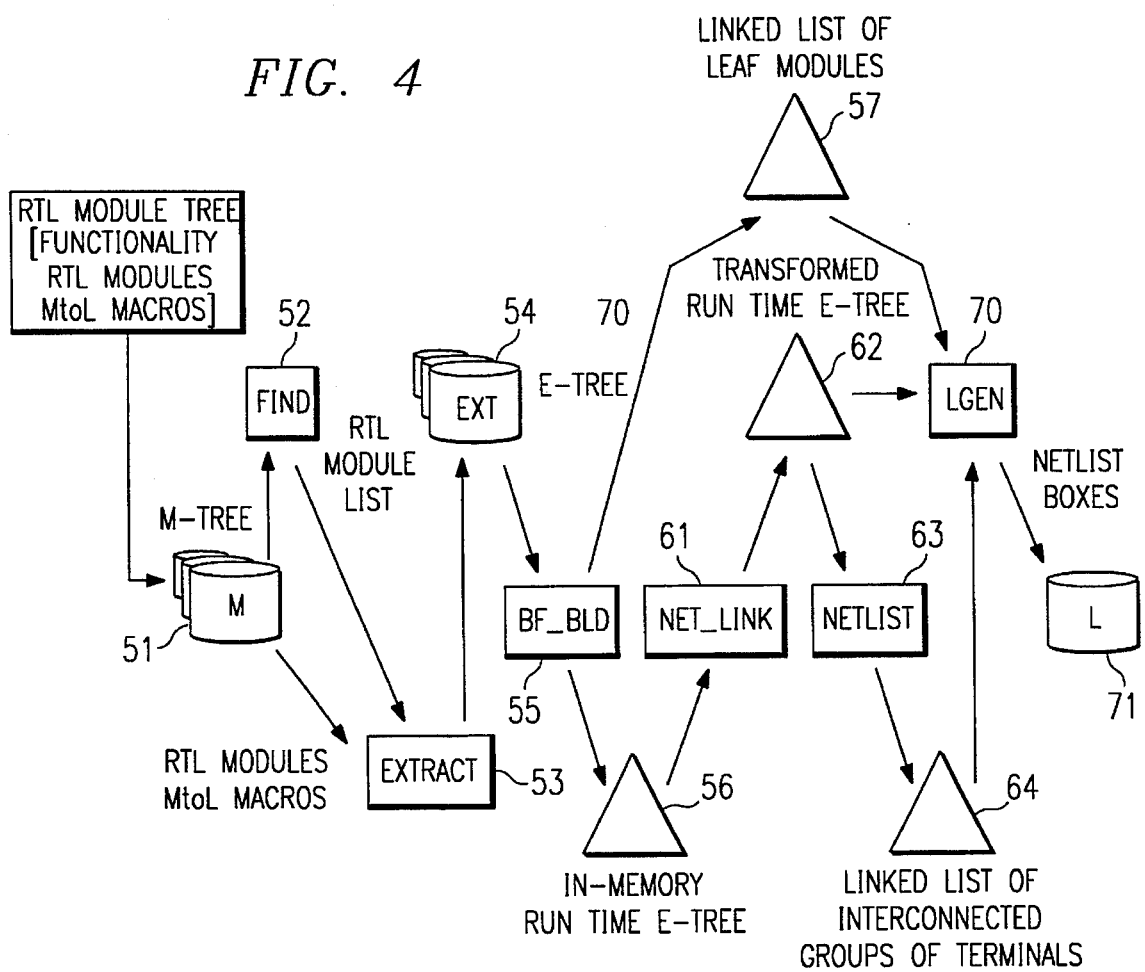
FIG. 4 is a flow diagram of the MtoL process.

FIG. 4 is a data flow diagram of the MtoL process. Additional information about MtoL program structure including program functions appears in Section 2.

The RTL behavioral model is stored in the form of a modified hierarchical RTL module tree, or M-tree (51), which includes the MtoL bounding box and terminal macros. The M-tree comprises the hierarchical logic block representation of the integrated circuit (for example, the hierarchical representation in FIG. 2b), together with the functionality included in the RTL behavioral model.

The MtoL extract front-end includes a find function (52) and an extract function (53). The find function (52) traverses the M-tree and generates a list of all the different RTL modules that characterize the hierarchical logic structure (each type of module is listed only once). Using this RTL module list, the extract function (53) extracts (a) the MtoL bounding box and terminal macros, and (b) the hierarchy of RTL modules which are converted into extract files according to the MtoL input format.

The output of the MtoL extract front-end is an hierarchical MtoL extract tree, or E-tree (54) which corresponds to the hierarchical M-tree. In particular, the E-tree includes an extract file for each of the RTL modules of the M-tree hierarchy including all duplicate modules.

The MtoL process then uses the extracted hierarchical E-tree to perform a flattening transformation. A build function (55) traverses breadth first the extracted E-tree, and builds in memory a run-time E-tree (56). During the traversal of the extract file hierarchy, the leaf nodes are placed in a linked list of leaf modules (extract files) (57) when they are encountered.

A netlink function (61) traverses breadth first the run-time E-tree, creating interconnect links between the terminals associated with each extract file of the hierarchy, and generating a correspondingly transformed run-time E-tree (62) containing a network of terminal traversal links.

A netlist function (63) completes the flattening transformation by creating a netlist—linked list of interconnected groups (nets) of terminals (excluding terminals contained in the intermediate blocks of the hierarchy) which describes a routing network. The netlist function traverses the run-time E-tree using a breadth first traversal to visit each block in the E-tree hierarchy. At each block, for each unvisited terminal, a depth first search is performed using the terminal traversal links to identify groups of interconnected terminals (nets). After each depth first traversal is completed, the resulting net is added to the netlist. The flattening transformation is accomplished by eliminating terminals of intermediate blocks of the hierarchy from each net. (See, Section 1.2.3.)

Figure 5:
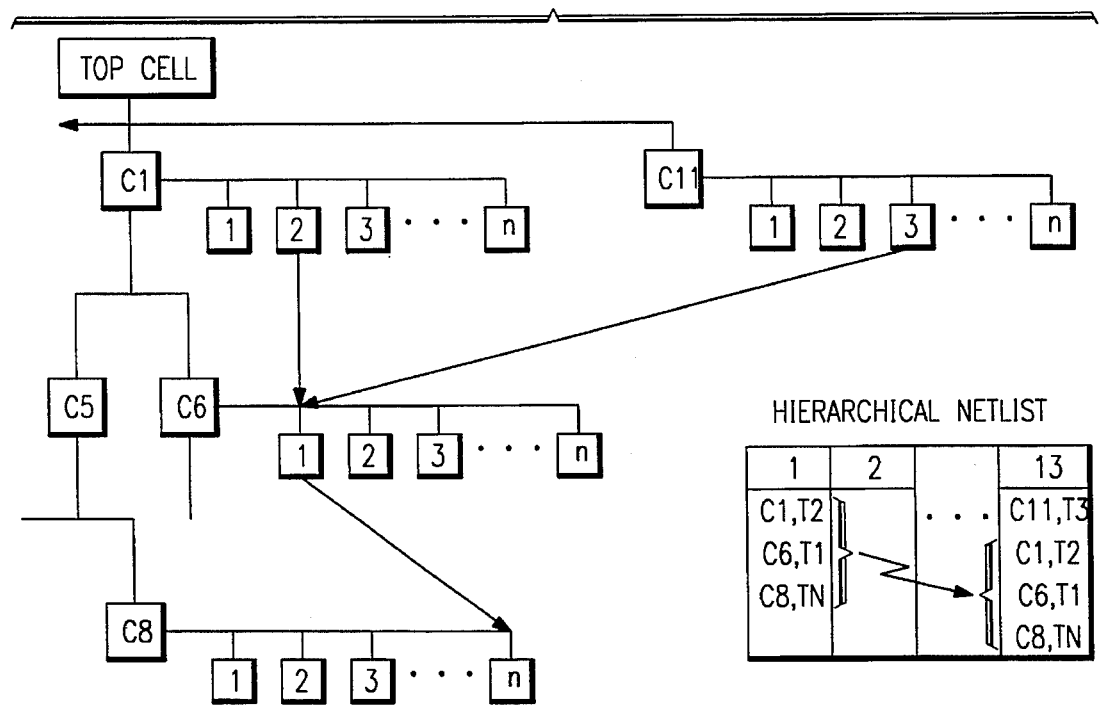
FIG. 5 illustrates the flattening transformation performed in connection with the generation of MtoL layout information.

FIG. 5 illustrates a collision procedure in the netlist function for handling collisions encountered during a depth first terminal traversal—a collision occurs when an unvisited terminal traversed using terminal traversal links encounters a terminal at a lower level of the hierarchy that has been visited in a previous terminal traversal. At that point, the two groups of terminals are merged into one net.

A module tree structure such as would be represented by an E-tree includes blocks C1, C6, C8, and C11. Associated with each block are n terminals, the definition of which is found in the E-tree (terminal location is found in the MtoL terminal macro for that block). Associated with each terminal is terminal interconnect data that identifies all other terminals to which it is connected. For block C1, the terminal T2 is connected to the terminal T1 for block C6, which in turn is connected to the terminal TN for block C8. For block C11, the terminal T3 is coupled to terminal T1 for block C6.

The Table within FIG. 5 represents a hierarchical netlist (i.e., non-flattened). Thus, a netlist 1 is created for the interconnected group that includes blocks C1, C6, and C8. The netlist 13 illustrates a netlist collision condition. The block C11 is connected to the block C6, which is already part of the interconnected group represented by netlist 1. Thus, block C11 is also interconnected with all of the blocks in netlist 1. Such collision situations are resolved by including in a higher level netlist those lower level netlists encountered in the netlist function search for that higher level netlist, i.e., netlist 1 is included in netlist 13 (with netlist 1 being rendered null).

An lgen function (70) completes the MtoL process by generating properly formatted MtoL layout information—bounding boxes (including geometry and terminal location), initial bounding box placements, and an associated terminal interconnect netlist. The lgen function (a) traverses the linked list of leaf modules (57) created by the build function (55) to access the information in the run time E-tree that describes bounding boxes (i.e., the MtoL bounding box and terminal macros), and (b) traverses the netlist created by the netlist function (64), outputting the terminal interconnect information. Lgen also creates a top level block, and generates the initial placements of the bounding boxes in the layout language.

For leaf nodes designated by MtoL leaf macros, lgen (a) generates MtoL layout information using the associated MtoL bounding box and terminal macros, or (b) in the case of an MtoL exist macro, retrieves the specified external file of layout information for output as MtoL layout information.

In particular, to interface the MtoL program to a particular floor planner and/or block router, the lgen function is conventionally configured to output the MtoL layout information in the format appropriate for such floor planner/block router.

1.2.1. MtoL Input Format. The exemplary MtoL program uses an MtoL extract front-end to convert an input RTL behavioral model, specifically the RTL modules, into an MtoL input format. This extract function makes the MtoL program independent of the modeling language (such as "C" or Fortran).

The selection of an input format is not a part of the invention. The EBNF definition of the formal syntax for an exemplary input format is set forth in Appendix A at the end of this Detailed Description.

1.2.2. MtoL Macros. The exemplary MtoL system incorporates a knowledge base that comprises a set of MtoL macros: MtoL Bounding Box Macros and MtoL Terminal Macros. These macros are introduced into the RTL module tree in a text editing operation that makes them invisible to the RTL behavioral modeling tool—the extract function extracts these macros for inclusion in the MtoL E-tree.

The MtoL bounding box macros define bounding box size, shape, and type:

BB_EXIST ("pathname")—bounding box exists at given pathname.

BB_LEAF—current module is a leaf module and is not traversed (an actual leaf module is automatically recognized by MtoL and does not need this macros).

BB_XY(x,y)—use x,y dimensions (real numbers).

BB_XD(x, d, t)—calculate y dimension using given x dimension and density (reals) and number of transistors (integer).

BB_YD(y, d, t)—calculate x dimension using given y dimension and density (reals) and number of transistors (integer).

BB_AD(a, d, t)—calculate dimensions using given aspect ratio and density (reals) and number of transitor (integer).

BB_PITCH(x,y)—terminal pitch in x and y dimensions (reals).

BB_LEVEL(XLEVEL, YLEVEL)—terminal levels (literal). XLEVEL=top and bottom sides, YLEVEL=left and right sides (these levels are overridden by the level designated in the BB_TERM terminal macro).

These MtoL bounding box macros should occur before terminal declarations.

The bounding box macros BB_LEAF (MtoL leaf macro) and BB_EXIST (MtoL exist macro) are used to designate intermediate level modules as leaf nodes. Specifically, the BB_LEAF macro may be attached to any intermediate module in the hierarchical E-tree, such that the build, netlink, and netlist functions that perform breadth first traversals and depth first searches of the E-tree will interpret that module as a leaf node. The BB_EXIST macro provides a pathname for an associated external file of pre-defined layout information.

During generation of the MtoL layout information, when the lgen function encounters a node with both the BB_LEAF and BB_EXIST macros, it imports the corresponding external layout information file, and merges that layout information for output as MtoL layout information—if BB_EXIST is not present, the lgen function generates the MtoL layout information using the associated MtoL bounding box and terminal macros.

The BB_LEAF/BB_EXIST macros are useful during iterative design operations in segregating layout information for those intermediate logic blocks for which the logic design will not change. As the design operation progresses, the portions of the logic design that become fixed can be incorporated into logic blocks treated as leaf nodes with pre-defined layout information. Indeed, entire functional blocks may become fixed in design and treated as leaf nodes in subsequent integrated circuits—for example, in FIG. 2a, the entire CPU module could be treated as a layout style logic block in the design of spin-off chips in which only memory and peripherals are changed. The MtoL terminal macros define the location of the bounding box terminals. The use of the MtoL terminal macros is illustrated by the following examples:

IN in1: BB_TERM("TOP MET2 7")
   meaning: INPUT in1 side=top level=MET2 track=7

IN bus1[16]: BB_TERM("LEFT MET1 1")
   meaning: INPUT bus1 size=16 side=left level=MET1 order=0–15 start_track=1 default_spacing=1

IN bus1[16]: BB_TERM ("LEFT MET1 [15:0] track=1 spacing=4")
   meaning: INPUT bus1 size=16 side=side=left level= MET1 order=15–0 start_track=1 spacing=4

IN bus1 [16]: BB_TERM("LEFT[15:12, 11, 0:10] track=1 spacing=4")

meaning: INPUT bus1 size=16 side=left order=15–12, 11, 0–10 start_track=1 spacing=4

The legal sides are TOP. LEFT. BOT. RIGHT. Level values are taken literally and can be any single word value. The default level is MET1 unless overridden by BB_LEVEL macro.

The order of the elements in the macro string must be as illustrated. A macro associated with a particular terminal must follow the terminal declaration.

1.3. Iterative Design Application. The automated MtoL process facilitates an iterative logic design process in which the MtoL layout information is evaluated to determine whether modifications in the logic design will or might improve performance—such evaluation may include what-if analysis. Since any modifications in the logic structure can be expected to induce changes in functionality, generally such modifications will be made to the RTL behavioral model so that the operation of the modified logic design may be simulated prior to running the MtoL program with the modified RTL module tree.

FIGS. 6a and 6b provide a flow diagram for an exemplary logic design application using the MtoL tool in conjunction with an RTL behavioral modeling tool and a floor planner/block router.

The RTL behavioral modeling process (80) includes the functions of developing (81) a high level specification, and then generating (82) an hierarchical RTL module tree, or M-tree, that is characterized by an initial partitioning into functional blocks. For use with the MtoL tool, the RTL M-tree can be modified by the inclusion (83) of MtoL bounding box and terminal macros.

The MtoL program is executed (91) with the modified M-tree, generating preliminary layout information— preliminary bounding boxes (with terminal locations), initial bounding box placements, and an associated preliminary terminal interconnect netlist.

The preliminary layout information is input to floor planner (92). Based on an evaluation of the floor planning results, the RTL M-tree may be refined (93) down to the layout style block level (i.e., data path logic, standard block logic, array, and controller).

After simulation by the RTL modeling tool, circuit implementations for the RTL modules associated with layout style blocks are implemented using conventional specialized routing tools that generate layout information. This layout information for the layout style blocks is placed in external layout information files, which are referenced by MtoL exist macros assigned to the corresponding leaf nodes of the M-tree that represent the layout style blocks.

Next, the floor planner is used to determine (95) intermediate partition blocks, and the RTL M-tree is modified to include the corresponding RTL modules.

The MtoL program is executed (101) with modified RTL M-tree including RTL modules for the intermediate partition blocks to generate corresponding MtoL layout information—bounding boxes, initial bounding box placements, and an associated terminal interconnect netlist.

This MtoL layout information is input to the floor planner (102) for floor planning analysis. Based on an evaluation of the floor planning results, the block router generates (103) the layout for the intermediate blocks. The corresponding intermediate RTL modules are assigned (104) leaf node status, and the corresponding layout information is stored in an external layout information file.

Next, the MtoL program is executed (111) on the chip level to generate chip level layout information. This layout information is input to the floor planner (112), and based on an evaluation of floor planning results, the block router generates the layout information for the chip.

2. MtoL Program Structure. The exemplary MtoL system is a UNIX-based software tool. It is designed to run generally on workstation platforms commonly used in computer aided logic design.

FIG. 7 illustrates the structure of the MtoL program, identifying the various program functions. The following is a functional description of the specified MtoL functions.

init—creates a global variable structure, initializes a binary name tree and a module queue, creates a new module for the top level behavior module, and enqueues the top level module into the module queue.

find—traverses the RTL module tree and generates a list of all the different RTL modules that characterize the hierarchical logic structure (each type of module is listed only once)

extract—traverses the RTL module tree and, for each RTL module, generates the corresponding MtoL extract file in the MtoL input format.

bf_bld—builds an RTL module hierarchy tree using a breadth first search of the modules (i.e., extract files)—the in-memory run-time E-tree. The top level module is enqueued in the module queue at the beginning of the program. The top level module is dequeued from the module queue, and the corresponding module extract file is parsed. When the parser encounters a module instance in the extract file, it enqueues those modules into the module queue. After the top level module is processed, a new module is dequeued from the module queue and processed. During the search of the RTL module hierarchy tree, the lower level modules are placed in a linked list of leaf module when they are encountered.

parse—reads the extract file associated with the current module taken from the module queue. Parameter, terminal, instance, and net information are read and stored in the module hierarchy tree for later processing.

deq_enq—dequeues a module from the module queue and enqueues that module's instances back onto the module queue. Used for breadth first tree traversal.

xnet—evaluates the explicit terminal interconnect information described by the modeling language at the current location in the module hierarchy tree and generates the link data structures for the associated explicit nets for each terminal (i.e., the terminal traversal links). These net links are later used as a traversal mechanism to build the netlist.

netm—evaluates the implicit terminal interconnect information described by the modeling language at the current location in the module hierarchy tree and generates the link data structures for the associated implicit nets for each terminal (i.e., the terminal traversal links). These net links are later used as a traversal mechanism to build the netlist.

net_link—controls the breadth first traversal of the module tree for linking explicit and implicit nets at each hierarchical level in the module hierarchy tree.

netlist—performs a breadth first traversal of the module tree. For each unvisited terminal associated with the modules in the current hierarchical level, a recursive depth first search is performed to produce a netlist.

lgen—Lgen evaluates each module in the leaf module list. If there is a reference to the actual layout data for the leaf module via the MtoL EXIST macro, the actual data is output to the module output file. Otherwise, the MtoL layout information is generated for the associated with the leaf module, and output to the layout information file.

In addition, the following conventional library functions are used by the MtoL program:

11_dequeue—a library function used to dequeue a data element from a queue.

11_enqueue—a library function used to enqueue a data element onto a queue.

fopen—a library function used to open a file.

fgets—a library function used to read a string from a file.

fclose—a library function used to close a file.

3. Conclusion. Although the Detailed Description of the invention has been directed to certain exemplary embodiments, various modifications of these exemplary embodiments, as well as alternative embodiments, will be suggested to those skilled in the art. For example, principles of the invention are generally applicable to converting a behavioral model into layout information. Moreover, the MtoL system could be included in an integrated computer aided logic design system the includes RTL modeling and floor planning/block routing (obviating the need for an MtoL extract front-end or a customized lgen function.

It is to be understood that the invention encompass any modifications or alternative embodiments that fall within the scope of the appended Claims.

---

APPENDIX A

---

EBNF Definition of the MtoL INPUT FORMAT

```
<model> ::= <file> {<file>}
<file> ::= <statement> {<statement>}
<statement> ::= <bb>| <sig> | <net> | <inst> | <netmod>
<bb> ::= <ex> | <xy> | <xd> | <yd> | <ad> | <pitch> |
<width>    | <leaf>
<ex> ::= TYPE EX <pathname>
<pathname> ::= [/][/]<pathnode>{/pathnode}
<pathnode> ::= <letter> {[.]<letter>}
<xy> ::= TYPE XY <real,real>
<xd> ::= TYPE XD <real,real>
<yd> ::= TYPE YD <real,real>
<ad> ::= TYPE AD <real,real>
<pitch> ::= PITCH <real,real>
<width> ::= WIDTH <real,real>
<leaf> ::= LEAF
<term> ::= <termtype> <termval>
<termtype> ::= IN | OUT | INOUT | VDD | GND
<TERMVAL> ::= <name> |<termpos>|<name><size>|<buspos>
<name> ::= <letter> {<letter>}
<termpos> ::= <side> |<track>|
<size> ::= '|'<integer>'|'
<buspos> ::= <side> |<order>| |<busplace>|
<order> ::= '|'<order_type> {<order_type>}'|'
<order_type> ::= <integer> | <integer>:<integer>
<busplace> ::= <track> |<spacing>|
<side> ::= TOP | BOT | LEFT | RIGHT
<track> ::= track=<integer>
<spacing> ::= spacing=<integer>
<net> ::= NET <netval> <netval>{ <netval>}
<netval> ::= |<name>.|<terml>
<terml> ::= <name>|<index>|
<index> ::= '|'<integer>'|'
<inst> ::= INST <name> <name>
<netmod> ::= NETM <name>{<name>}
<real> ::= <digit>{<digit>}|.<digit>{<digit>}|
<integer> ::= <digit>{<digit>}
<digit> ::= 1|2|3|4|5|6|7|8|9|0
<letter> ::= a|b|c|d|e|f|g|h|i|j|k|l|m|
             n|o|p|q|r|s|t|u|v|w|x|y|z|
             A|B|C|D|E|F|G|H|I|J|K|L|M|
             N|O|P|Q|R|S|T|U|V|W|X|Y|Z|_
```

MtoL OUTPUT FORMAT

```
<bfile> ::= <header> {<cell> <open> {<statement>} <close>}
<header> ::= L:: TECH ANY
<cell> ::= BBOX <name> O ;
<name> ::= <letter>{<letter>}
<open> ::= '{'
>close> ::= '}'
<statement> ::= <term> | <inst> | <net>
<term> ::= <termtype> MET1 <termname> <width> <placement>;
<termtype> ::=       IN | OUT | INOUT | VDD | GND
<termname> ::= <name>|<index>|
<index> ::= '|'<integer>'|'
<width> ::= W=<integer>
<placement> ::= ( <real>, <real> )
<inst> ::= INST <name> <name> <placement>;
<net> ::= NET <netterm>, <netterm> {,<netterm>} ;
<real> ::= <digit>{<digit>}|.<digit>{<digit>}|
<integer ::= <digit>{<digit>}
<letter> ::= a|b|c|d|e|f|g|h|i|j|k|l|m|
```

-continued

APPENDIX A n|o|p|q|r|s|t|u|v|w|x|y|z|
A|B|C|D|E|F|G|H|I|J|K|L|M|
N|O|P|Q|R|S|T|U|V|W|X|Y|Z|

What is claimed is:

1. An MtoL (behavioral model to layout information) method for converting an RTL (register transfer level) behavioral model in the form of an RTL module tree including a plurality of hierarchical RTL modules representing the logic structure and functionality of an integrated circuit, into MtoL layout information for use in a block router, comprising the steps:

assigning to selected ones of the RTL modules MtoL macros that define corresponding geometric and terminal information;

extracting these MtoL macros along with the RTL modules for inclusion in the MtoL extract tree;

extracting from the RTL module tree the hierarchical RTL modules to create a corresponding hierarchical MtoL extract tree;

performing a flattening transformation of the hierarchical Mtol extract tree to provide a non-hierarchical representation including a terminal interconnection netlist, said performing said flattening transformation accomplished by the substeps of performing a breadth first traversal through the hierarchical MtoL extract tree to create a linked list of all leaf nodes, which correspond to layout style blocks or intermediate blocks designated as leaf nodes, and performing a depth first search of the Mtol extract tree to generate a netlist that describes a routine network; and using the non-hierarchical representation and terminal interconnect netlist, generating MtoL layout information.

2. The MtoL method of claim 1, wherein the MtoL layout information includes bounding boxes (including geometry and terminal location), initial bounding box placements, and an associated terminal interconnect netlist.

3. The MtoL method of claim 1, wherein the MtoL macros are MtoL bounding box and terminal macros that define bounding box geometry and terminal location.

4. The MtoL method of claim 1, wherein the RTL modules are written in a modeling language that is not in an MtoL input format, and wherein the step of extracting hierarchical RTL modules from the RTL module tree is accomplished by converting the RTL modules into extract files according to an MtoL input format.

5. The MtoL method of claim 1, wherein the netlist comprises a linked list of interconnected groups of terminals excluding terminals contained in the intermediate blocks of the hierarchy.

6. The MtoL method of claim 1, wherein the step of generating MtoL layout information, is accomplished using the list of leaf nodes and the netlist.

7. The MtoL method of claim 6, further comprising the step of:

assigning to selected intermediate blocks MtoL leaf macros that designate such blocks as leaf nodes;

such that MtoL layout information is generated for such intermediate blocks.

8. The MtoL method of claim 7, further comprising the step of:

assigning MtoL exist macros to selected ones of the intermediate blocks designated as leaf nodes by MtoL leaf macros, with each MtoL exist macro identifying a corresponding external file of layout information for the associated intermediate block;

such that, for each MtoL exist macro, the step of generating layout information is accomplished by importing the associated external file of layout information for output as MtoL layout information.

9. An MtoL (behavioral model to layout information) method for converting an RTL (register transfer level) behavioral model in the form of an RTL module tree including a plurality of hierarchical RTL modules representing the logic structure and functionality of an integrated circuit, into MtoL layout information for use in a block router, comprising the steps:

assigning MtoL macros to selected ones of the RTL modules, said MtoL macros defining corresponding bounding box and terminal location information for said assigned RTL modules;

extracting from the RTL module tree the hierarchical RTL modules and MtoL macros to create a corresponding hierarchical MtoL extract tree;

performing a flattening transformation of the hierarchical Mtol extract tree to provide a non-hierarchical representation including a terminal interconnection netlist; and using the non-hierarchical representation and terminal interconnect netlist, generating MtoL layout information in the form of bounding boxes (including geometry and terminal location), initial bounding box placements, and an associated terminal interconnect netlist, said MtoL layout information generated for RTL modules not having assigned MtoL macros including said geometry and terminal location for bounding boxes having default bounding box geometries that is a smallest bounding box that Will accommodate a number of terminals assigned to said RTL module and a random distribution of terminal locations around said bounding box.

10. The MtoL method of claim 9, wherein the RTL modules are written in a modeling language that is not in an MtoL input format, and wherein the step of extracting hierarchical RTL modules from the RTL module tree is accomplished by converting the RTL modules into extract files according to an MtoL input format.

11. The MtoL method of claim 9, wherein the flattening transformation is accomplished by the substeps of:

performing a breadth first traversal through the hierarchical MtoL extract tree to create a linked list of all leaf nodes, which correspond to layout style blocks or intermediate blocks designated as leaf nodes; and performing a depth first search of the MtoL extract tree to generate a netlist that describes a routing network in the form of a linked list of interconnected groups of terminals excluding terminals contained in the intermediate blocks of the hierarchy.

12. The MtoL method of claim 11, further comprising the steps of:

assigning to selected intermediate blocks MtoL leaf macros that designate such blocks as leaf nodes;

assigning MtoL exist macros to selected ones of the intermediate blocks designated as leaf nodes by MtoL leaf macros, with each MtoL exist macro identifying a corresponding external file of layout information for the associated intermediate block;

such that MtoL layout information is generated for such intermediate blocks either directly, or in the case of a leaf node assigned an MtoL exist macro, by importing the associated external file of layout information for output as MtoL layout information.

* * * * *